(12) United States Patent
Ziarati et al.

(10) Patent No.: US 12,257,606 B2
(45) Date of Patent: *Mar. 25, 2025

(54) MRI MAGNET ROOM CLEANING SYSTEM

(71) Applicant: Resonance Technology, Inc., Northridge, CA (US)

(72) Inventors: Mokhtar Ziarati, North Hollywood, CA (US); Parisa Ziarati, Granada Hills, CA (US)

(73) Assignee: Resonance Technology, Inc., Northridge, CA (US)

( * ) Notice: Subject to any disclaimer, the term of this patent is extended or adjusted under 35 U.S.C. 154(b) by 231 days.

This patent is subject to a terminal disclaimer.

(21) Appl. No.: 17/872,339

(22) Filed: Jul. 25, 2022

(65) Prior Publication Data

US 2022/0355349 A1 Nov. 10, 2022

Related U.S. Application Data

(63) Continuation of application No. 16/694,175, filed on Nov. 25, 2019, now Pat. No. 11,396,035.

(51) Int. Cl.
*B08B 15/00* (2006.01)
*G01R 33/28* (2006.01)

(52) U.S. Cl.
CPC ............ *B08B 15/002* (2013.01); *G01R 33/28* (2013.01)

(58) Field of Classification Search
None
See application file for complete search history.

(56) References Cited

U.S. PATENT DOCUMENTS

| 11,396,035 B2 * | 7/2022 | Ziarati ................. B08B 15/002 |
| 2002/0112744 A1 * | 8/2002 | Besseling ........... A47L 11/4011 15/345 |

* cited by examiner

*Primary Examiner* — Rodney E Fuller
(74) *Attorney, Agent, or Firm* — Larry K. Roberts

(57) ABSTRACT

A cleaner system for an MRI magnet room. The system includes a base vacuum and/r steam unit configured to supply vacuum and/or steam, the unit disposed outside the MRI magnet room. A hand-held or portable dispensing unit is substantially free of magnetic material so that it is safe to use inside the magnet room. A tubing system for conveying vacuum and/or steam from the base unit to the handheld unit, the tubing system including a magnet room portion configured for disposition inside the magnet room and free of magnetic material. A communication link is configured to communicate control signals generated by user manipulation of a control panel to the base unit.

19 Claims, 15 Drawing Sheets

MRI MAGNET ROOM CLEANING SYSTEM

BACKGROUND

This application claims the benefit of U.S. Non-Provisional application Ser. No. 16/694,175 filed Nov. 25, 2019; the entire contents of which application are hereby incorporated by reference.

In the past 30 years of the MRI existence in the market, there has been many advances in safety and image quality, but there has not been any equipment to make the magnet or scanner room clean and germ free.

The safety of the caregiver and the patients is of paramount importance in the hospital environments. Cleanness of the magnet room is difficult because of the MRI magnet. Under the table and under the magnet also in many MRI room, layers of dust has piled up due to the fact that cleaning crew do not have a good way to do any detail cleaning such as vacuum and disinfecting of the room.

Conventional handheld-vacuum cleaners with long hoses have been used in the MRI with the condition that the actual power unit has to be 10 feet away from the actual MRI magnet. This solution is not acceptable because the actual vacuum system is highly magnetic and if a cleaning person unknowingly brought it close to the magnet, that could be catastrophic, leading to a serious injury or death, if the unit turns into a dangerous projectile. In the past, there are reported cases in which persons were seriously injured in the instances where the person accidently took the ferro-magnetic equipment's inside the magnet room.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
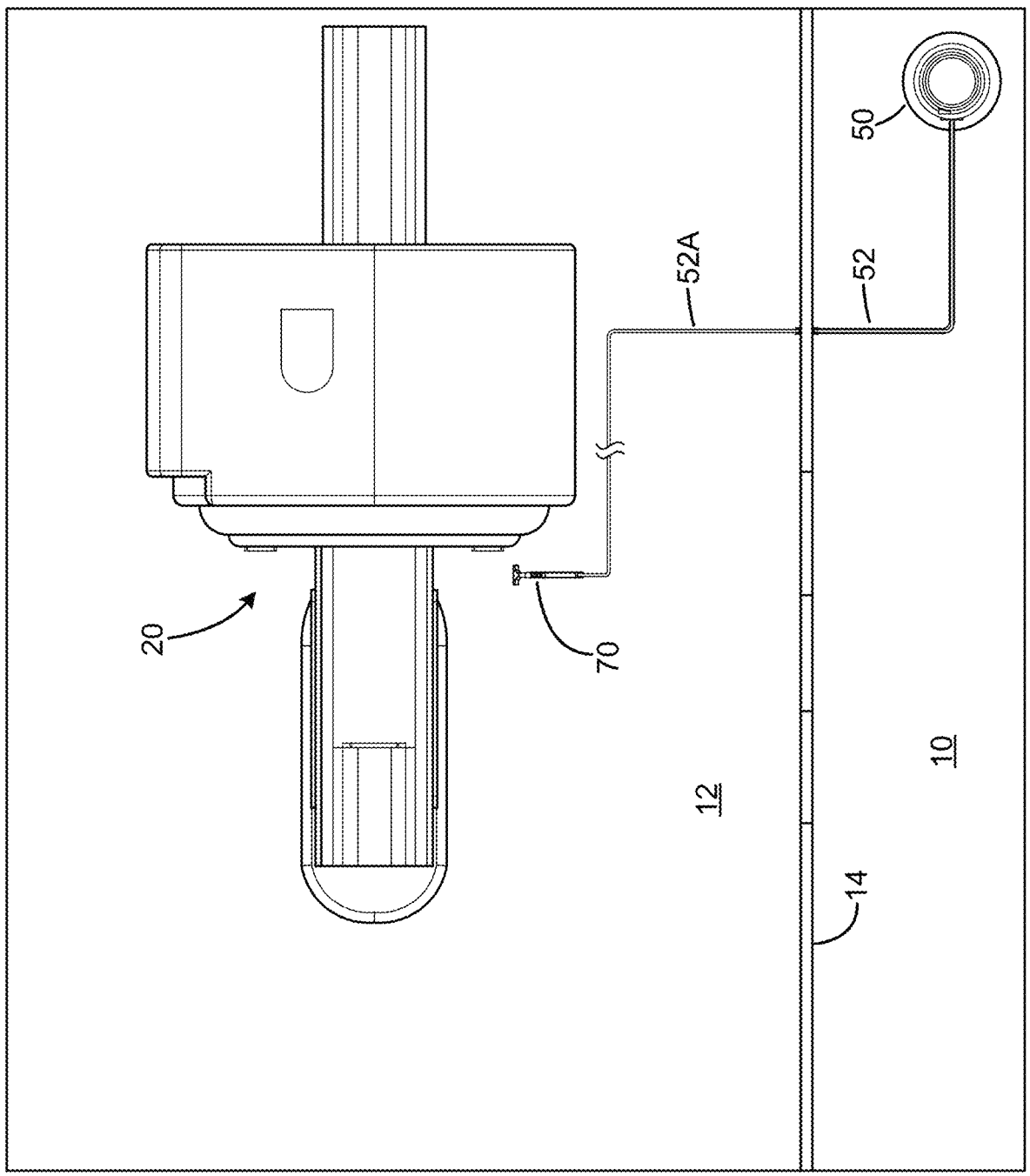
FIG. 1 is a diagrammatic top view of a vacuum and steam cleaning system in an existing/functional MRI suite of an equipment/computer room and an adjacent magnet room.

In the following detailed description and in the several figures of the drawing, like elements are identified with like reference numerals. The figures are not to scale, and relative feature sizes may be exaggerated for illustrative purposes.

Figure 2:
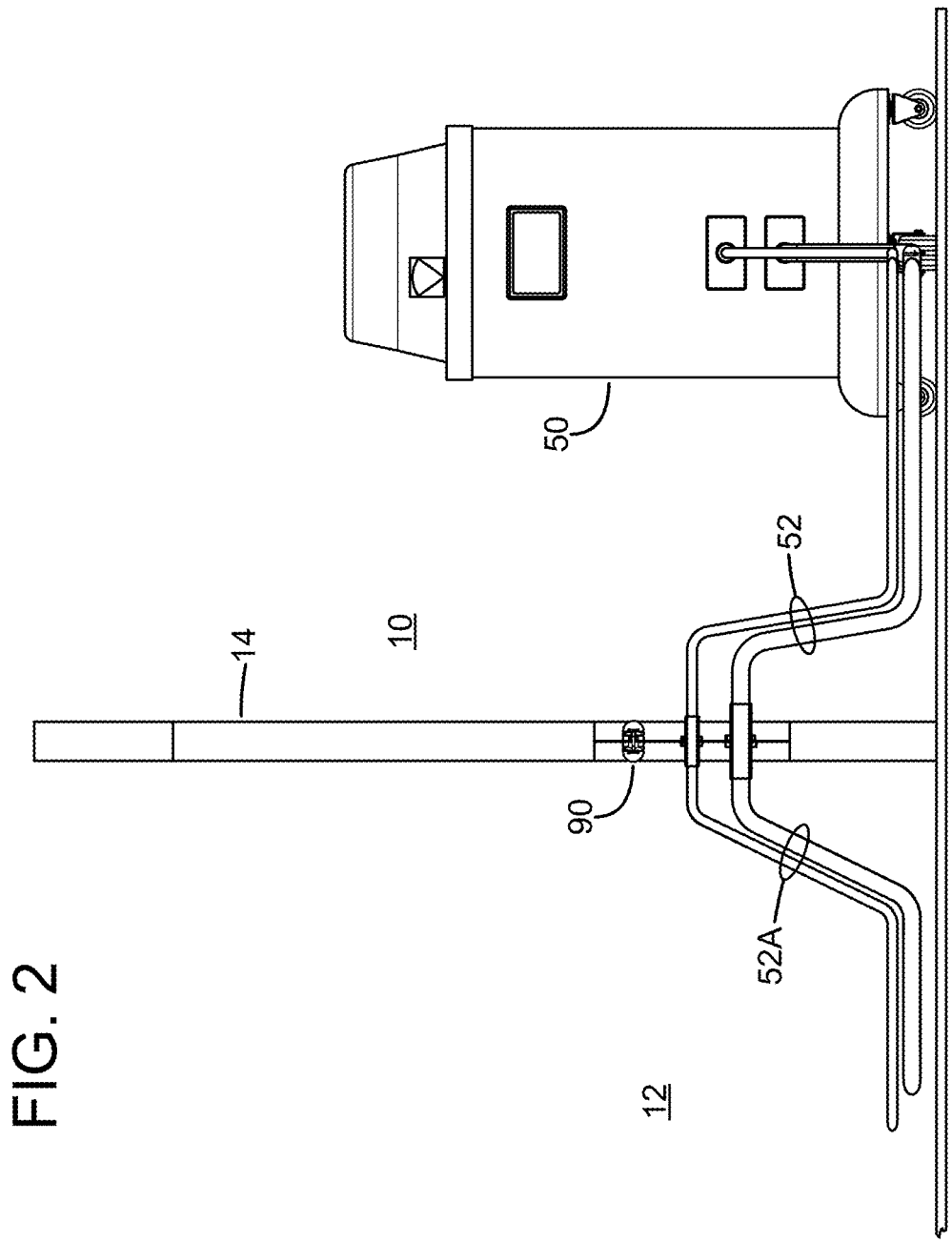
FIG. 2 is a diagrammatic side illustration of the tubing/hoses passed through the penetration room of the system of FIG. 1.
Figure 3:
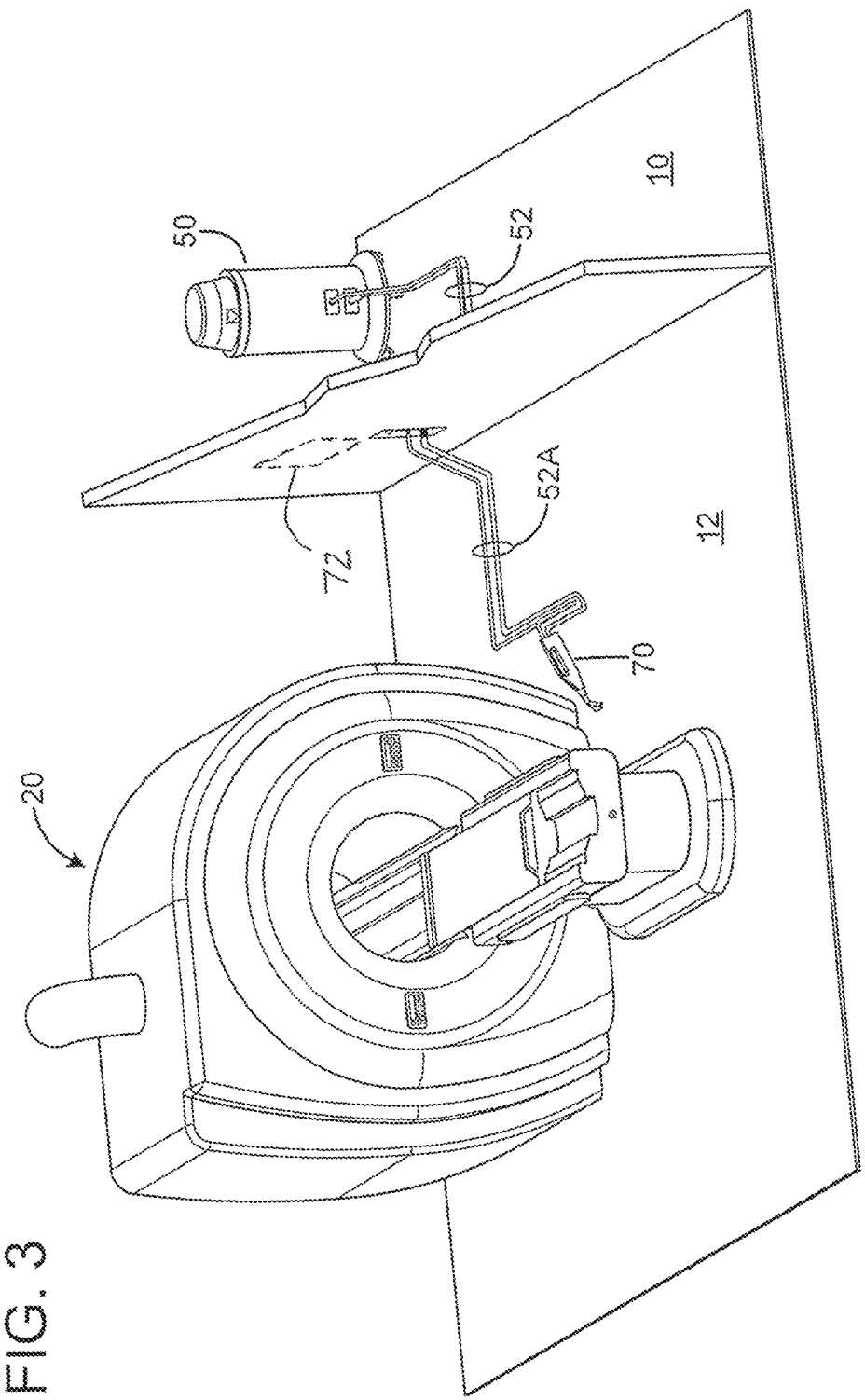
FIG. 3 is a further diagrammatic view of the MRI suite installation of FIG. 1.
Figure 4:
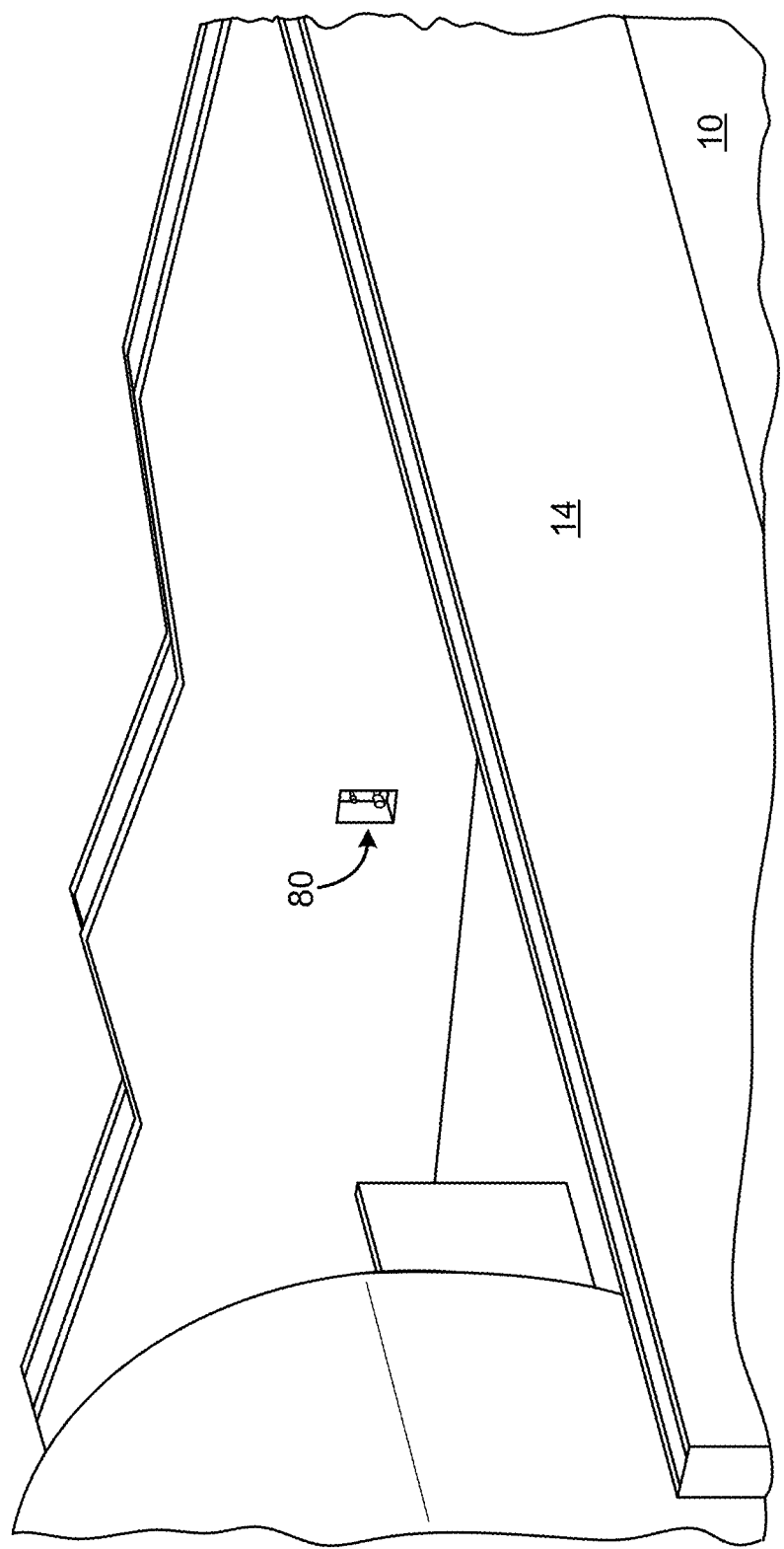
FIG. 4 illustrates an exemplary air suction and steam port of the tubing system for a second embodiment of an installation in which the tubing system includes a network of tubing embedded in walls of the MRI magnet room.
Figure 5:
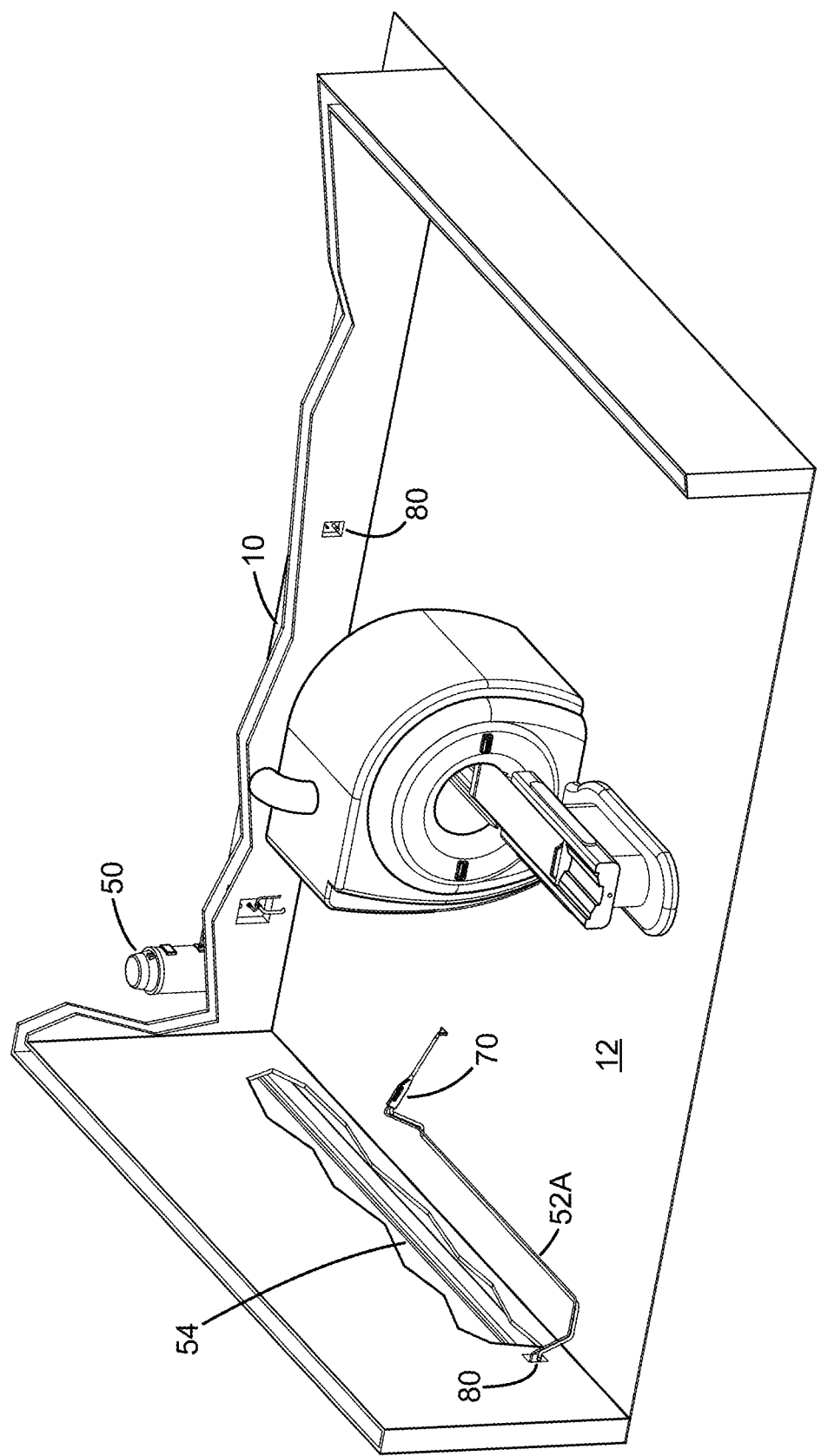
FIGS. 5 and 6 diagrammatically illustrate a portion of a network of hoses/tubing installed in the MRI room wall in the second embodiment of the invention.
Figure 6:
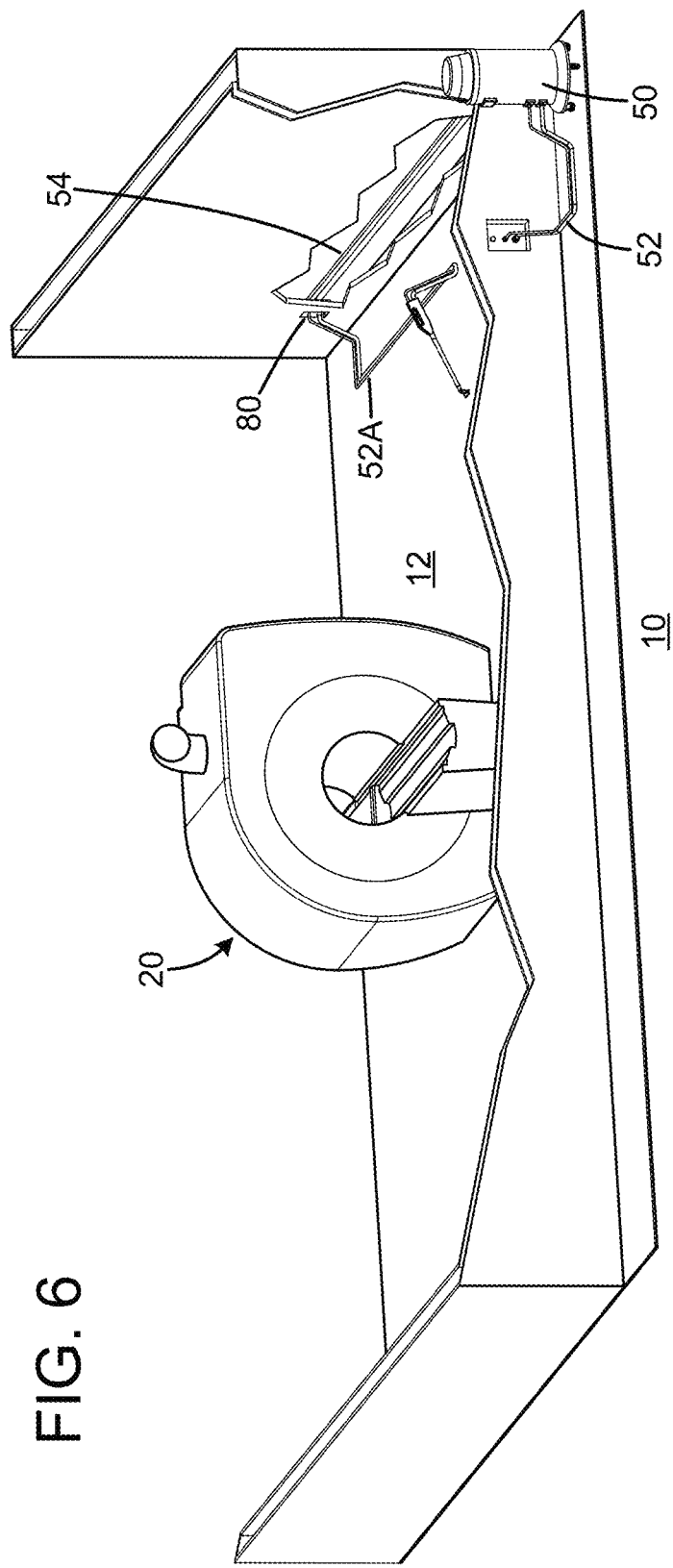
Figure 7:
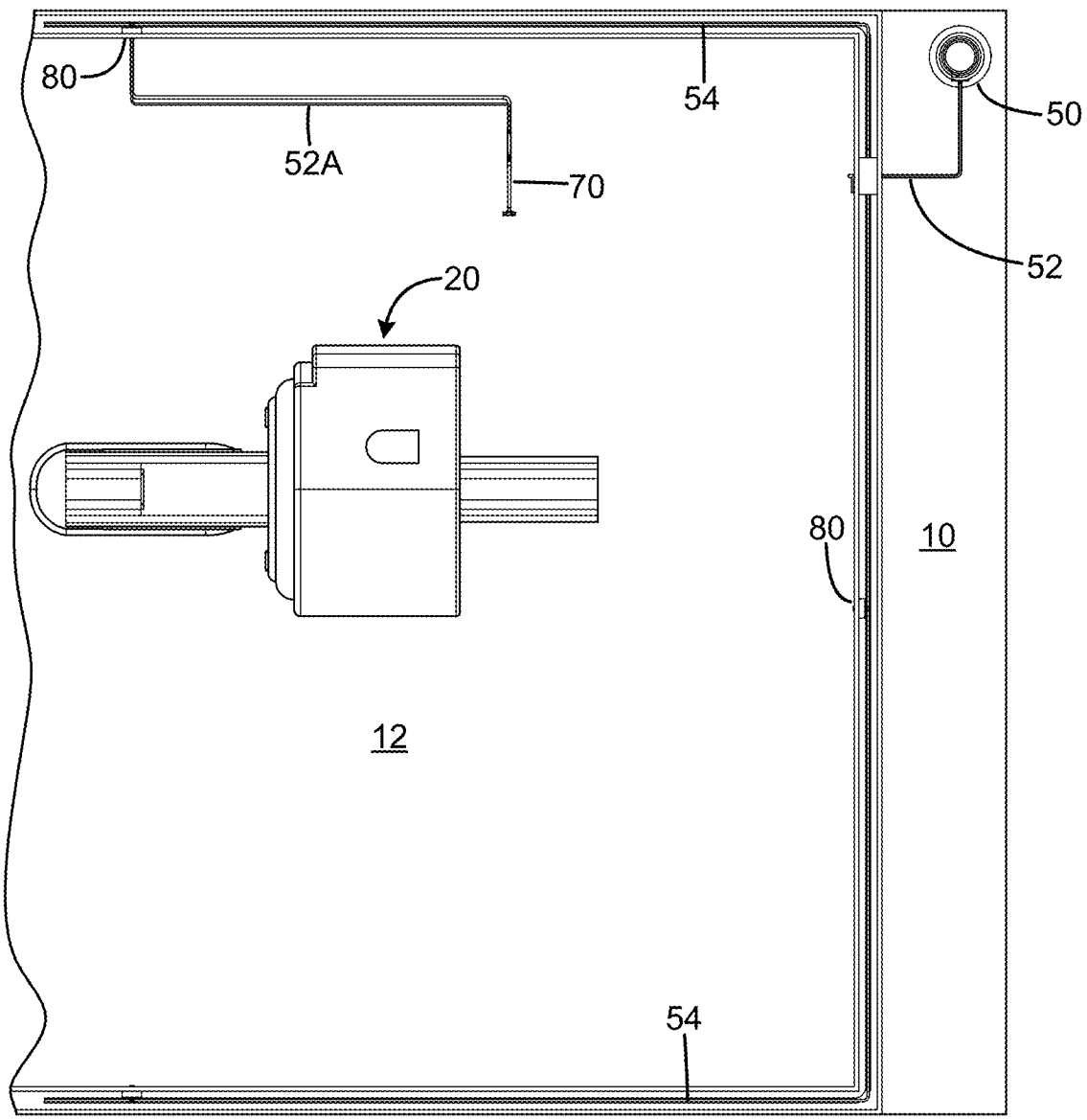
FIG. 7 is a schematic top view illustration of the second embodiment of the system, in which a network of tubing/hoses is embedded within walls of the MRI room.
Figure 8:
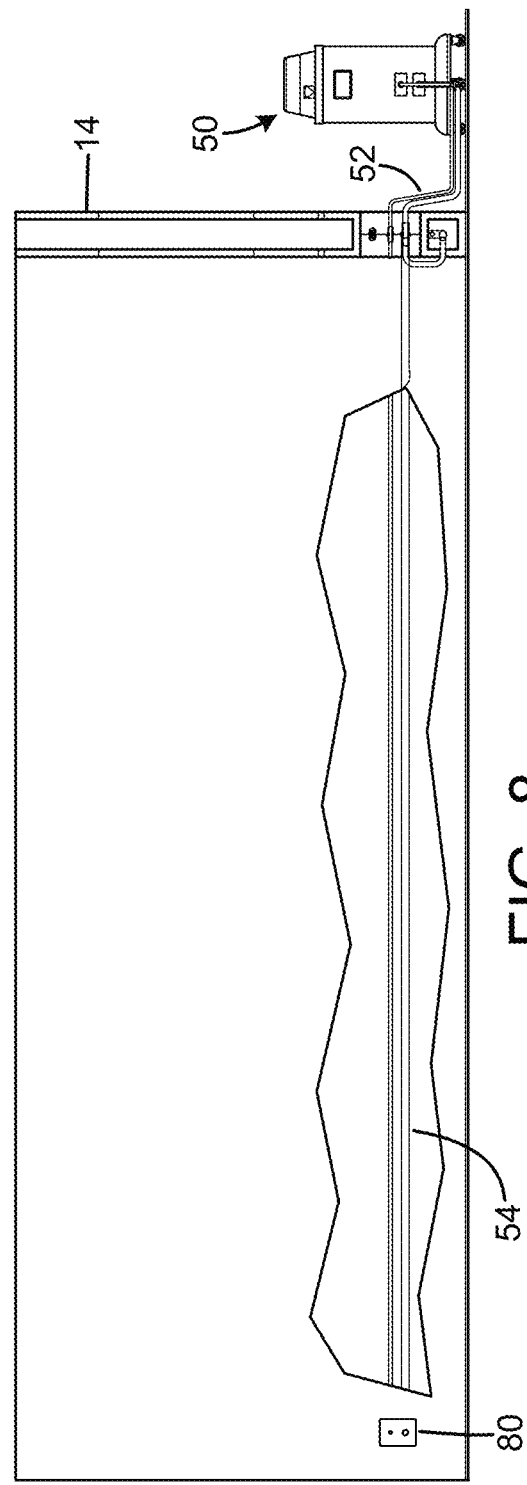
FIG. 8 is a diagrammatic depiction of an exemplary connection of the base unit to the penetration panel for the second embodiment.

There are described herein three exemplary embodiments of a system for cleaning and sanitizing an MRI magnet room, including vacuum/steam hoses/tubing with steam cleaning capabilities. The first embodiment (FIGS. 1-3) is for the case of an existing MRI scanner 20 already built and operational. A combined vacuum and steam cleaner base unit 50 with sufficient suction and steam power is installed inside the MRI equipment/computer room 10, as it typically has significant magnetic material, such as pumps, tanks and the like. The system tubing/hoses 52 are connected from the base unit 50 to connector ports on one side of the penetration panel 14A in the wall 14. Vacuum/steam tubing/hoses 52A are connected to the connector ports on the magnet room via penetration panel 14A (FIG. 10) inside the magnet room with long enough retractable tubing/hoses sections 52A that preferably can reach all four corners of the magnet room with both vacuum and steam. The hoses 52A are connected to a handheld or portable dispensing unit 70 adapted for use in the magnet room.

In an exemplary embodiment, the hoses 52A and the dispensing unit are generally free of magnetic material, and may be classified as "MR conditional" items, according to the definitions set out in "MR Labeling Information for Implants and Devices," Frank G. Shellock et al, Radiology, Volume 253, No. 1, October 2009, pages 26-30, the entire contents of which are incorporated herein by this reference. The hoses and dispensing unit would not typically be in use during an MRI procedure in the magnet room.

Figure 1A:
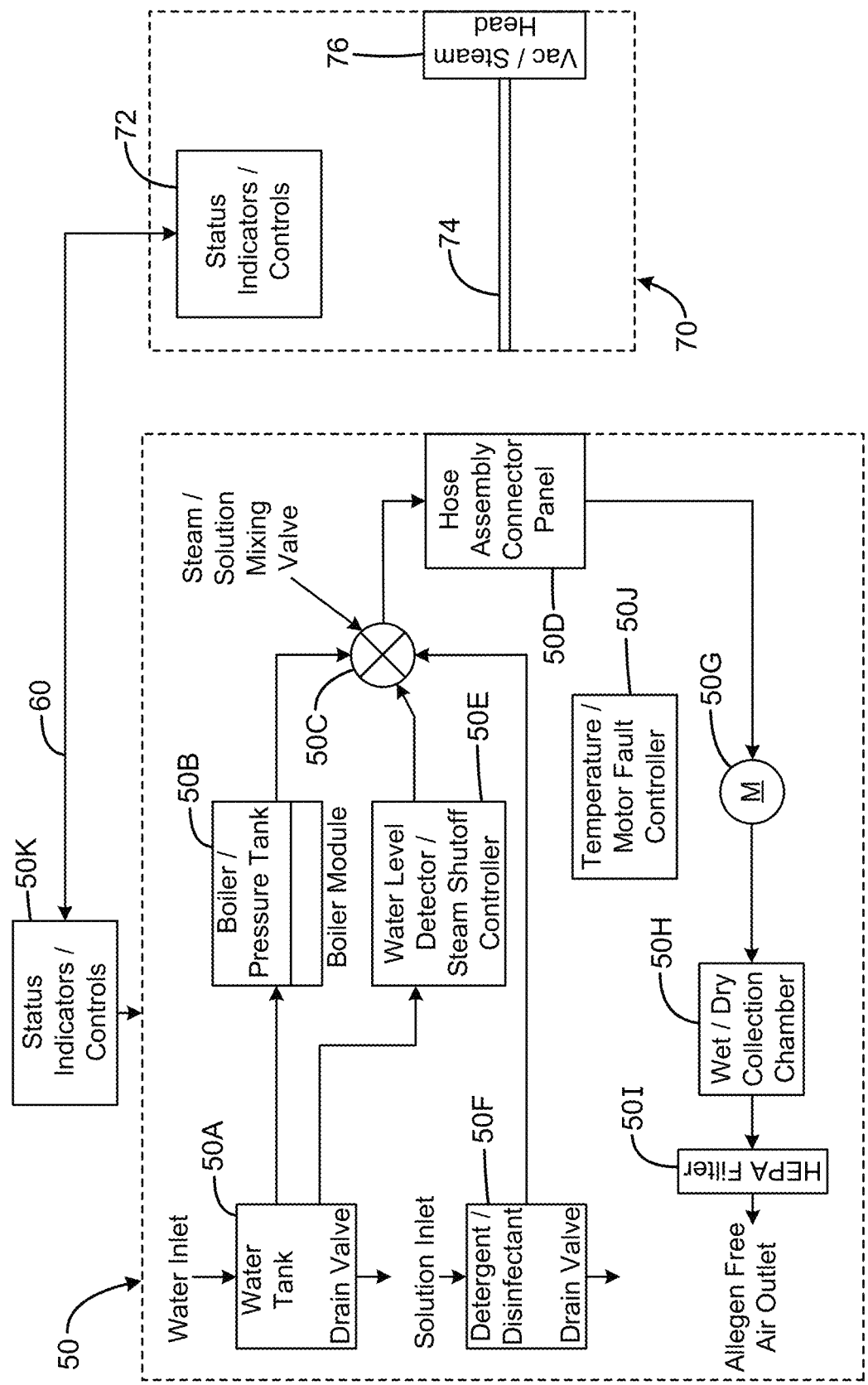
FIG. 1A is a schematic illustration of the system base unit and the handheld or portable dispensing unit.

FIG. 1A is a diagrammatic diagram of the base unit 50 and the handheld or portable dispensing unit 70. The base unit 50 includes a vacuum pump 50G and a steam generator with includes a water tank 50A, a boiler module 50B with a boiler/pressure tank, which generates steam from the water. A supply of detergent/disinfectant solution is held in tank 50F. A steam/solution mixing valve 50C is connected to the boiler module and the tank 5OF to mix the solution with the steam. wherein the detergent/disinfectant may be dispensed into the steam prior to leaving the base unit 50. A controller 50E monitors the water level and shuts off the steam if the water level is low. The steam/solution is conveyed through a hose to the hose assembly connector panel 50D. The purpose of steam is for cleaning as well as disinfection of the room and anything else necessary inside the magnet room.

The vacuum pump 50G is also connected by a hose segment to the connector panel 50D. The pressure side of the pump is connected to a wet/dry collection chamber and then passed through a HEPA filter 501 for discharge into the atmosphere. The connector panel 50D may then be connected to hoses 52 (not shown in FIG. 1A). Ultimately the steam/vacuum lines (not shown in FIG. 1A) are connected to the handheld/portable dispensing unit 70, connected through extension 74 to the vacuum/steam head 76. The unit 70 includes controls and status indicators 72, which communicates with base unit controls and status indicators 50K via a communication link generally indicated as link 60. The link may be wireless, wired, or a hybrid, as described more fully below.

It is to be understood that, while a combined steam/vacuum system has been described, the cleaning system may employ only a vacuum system without steam, or only a steam system without vacuum. In the steam only case, the vacuum pump and vacuum hoses may be omitted. In the vacuum only case, the water tank, detergent/disinfectant tank, the boiler module, the controller and the mixer, with the associated steam hoses, may be omitted.

The particulars of the setup depend on the layout of the existing MRI site. The steam and vacuum hoses include an equipment/control room portion 52 and an MRI magnet room portion 52A, connected in the magnet room via the penetration panel 14A. The magnet room side of the hoses 52A are long enough to reach all corners of the MRI room. After the service the hoses 52A can be coiled and stored in the cabinet of the penetrating panel 14A. A typical length of the hoses 52A may be between 20 to 30 feet.

Figure 10:
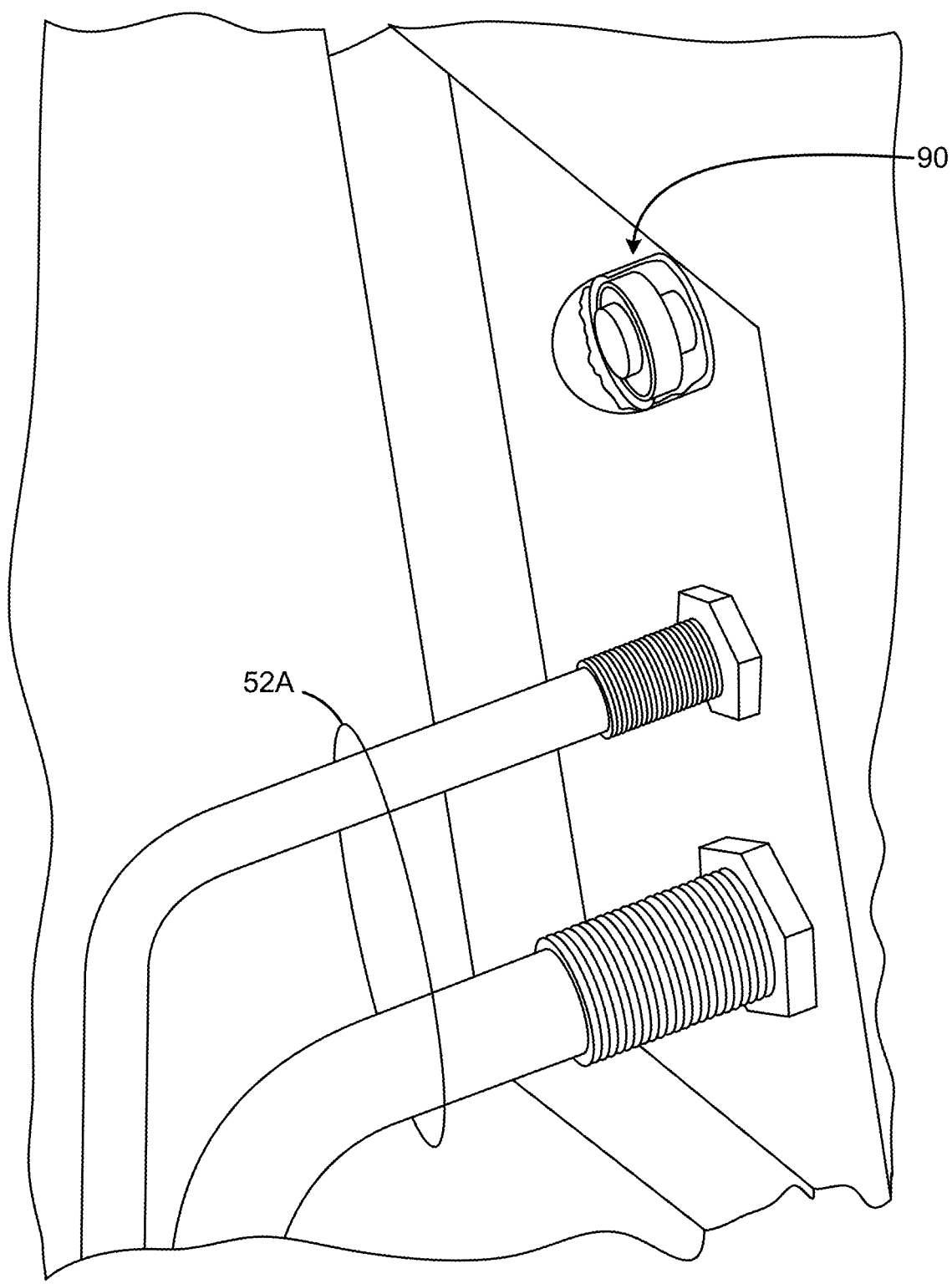
FIG. 10 is a diagrammatic illustration of the IR signal controller interface mounted to the penetration panel with the tubing/hoses.

The hoses 52A may be designed to retractable or simply coil and hang on the wall of the penetration panel 14A. A jacket may be included to enclose both steam and vacuum hoses. Connectors in the penetration panel provide for the hoses 52 and 52A to be interconnected at the penetration panel or at wall-mounted ports, as shown in FIG. 10.

The hoses 52A are connected to the handheld or portable dispensing unit 70, to be described in more detail below. The hoses 52A are preferably substantially free of stiffeners made of magnetic material such as ferrous spring wire. Stiffeners made of stainless steel could be employed; the material is not to be used inside the bore or tunnel of the MRI during imaging. A communication system or link 60 (FIG. 1A), examples of which are described more fully below, allows the user of the handheld unit to communicate with the base unit, in this exemplary embodiment, to control the base unit in supplying vacuum/steam. The communication system is designed for use in the magnet room, preferably without significant magnetic material. The communication system includes a control module or panel powered by a non-magnetic battery and mounted in the unit 70 (FIG. 1A), or alternatively on a wall or other structure within the magnet room (shown in dashed lines in FIG. 3).

A second embodiment is configured for the case in which a new magnet room is constructed, so that the system may be integrated with the design. The hoses/tubing 54 for both steam and air suction connections may be installed in all walls of the MRI magnet room, with several openings or ports with spring loaded vacuum-sealed caps, similar to conventional vacuum systems used in a central vacuum system in some newly built houses. This has the advantage of being strategically neater. The MRI cleaning crew can plug the steam and vacuum hoses 52A in any one of the four ports 80 located on any of the four walls of the MRI suite for cleaning. When use of the cleaning system is finished, the hoses can be disconnected from the ports, and the ports will automatically shut close so no air or steam would be released into the room. See FIGS. 4-8.

Figure 9:
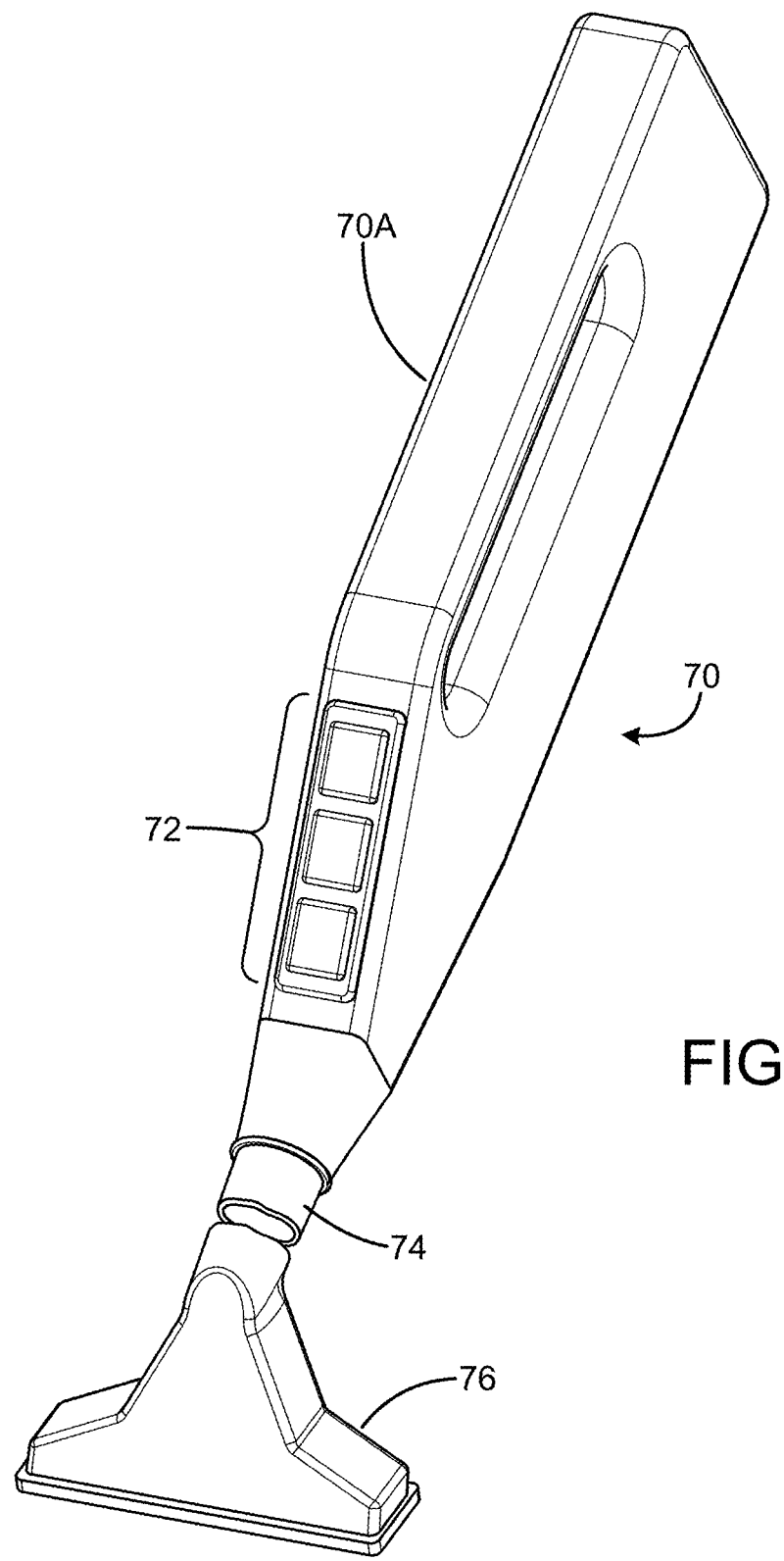
FIG. 9 is a diagrammatic isometric view of an exemplary embodiment of the handheld or portable dispensing unit.

For either the first or second embodiment of the tubing/hose installation, the installation will include a handheld or portable dispensing unit 70 (FIG. 9) in communication with a Signal Controller interface 90. By handheld or portable, in the exemplary embodiment, the unit 70 has a control or handle end manipulated by the user, and a tool or head 76 through which vacuum and steam are administered to the surface or object. The tool end may have wheels to provide support. The unit 70 is connected to the distal end of the hoses 52A in the magnet room and is substantially free of magnetic material so that it can be used safely in the magnet room. The electronic components may have a small amount of iron and not be totally non-magnetic since the handheld unit is not used over the patient during an MRI or iMRI scan, would not have a negative effect on MRI images, and the mass is so small as to be negligible in relation to the mass of the entire unit 70. The unit has dispensing openings to separately deliver suction and steam at the outlet end of the unit. There is typically an extension tube 74, 3 to 4 feet in length, connecting the control head portion 70A to the dispensing tool 76. The tool 76 may be interchangeable with other tools, depending on the application.

In an exemplary embodiment, the handheld or portable dispensing unit 70 includes a head control 72 (FIGS. 1A, 9 and 12-14) which allows the user to control the base unit 50, with switches to control vacuum (on/off), steam (on and steam volume selector), and to display the base unit steam tank water level and the steam volume selected by the user.

The interface 90 assists in communication between the unit 70 connected to the distal end of the hoses 52A. The communication between the two components, the unit 70 and base/steamer unit 50, is configured so that control of the vacuum and steam system may be executed by the user working in the magnet room 12, by manipulating controls 72 on the unit. The controls 72 in this exemplary embodiment include, but are not limited to, the steam-temperature setting, suction-ON, suction-OFF, steam-ON, and steam-OFF. The communication in exemplary embodiments is via IR/RF/Bluetooth links, via IR/RF/direct wire connections, or by direct wire connections. The communication link is preferably bidirectional so that the handheld unit can control the base unit 50 and the system status can display on the handheld unit.

A wireless communication interface adaptable to this system is described in U.S. Pat. No. 10,083,598, Alert System for MRI Technologist and Caregiver, the entire contents of which are incorporated herein by this reference.

Figure 11:
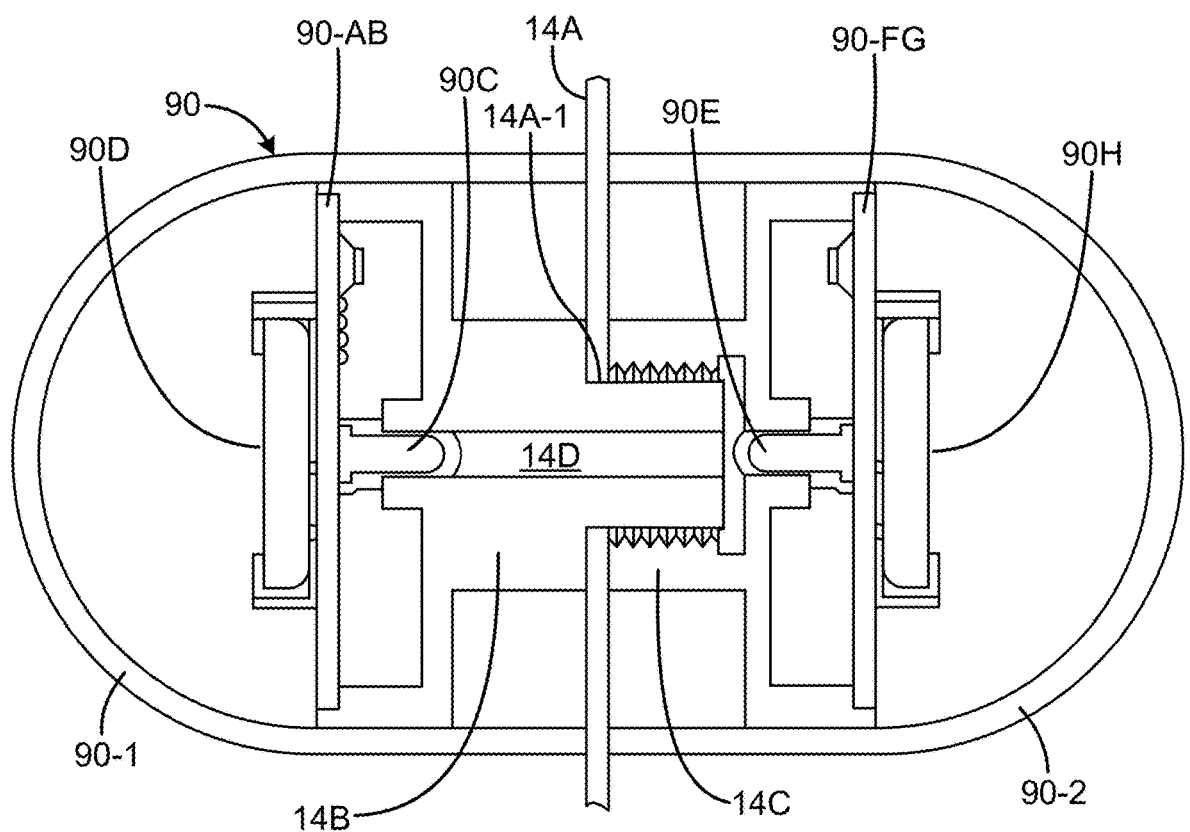
FIG. 11 diagrammatically illustrates an exemplary embodiment of an IR signal controller interface device as in FIG. 10.
Figure 12:
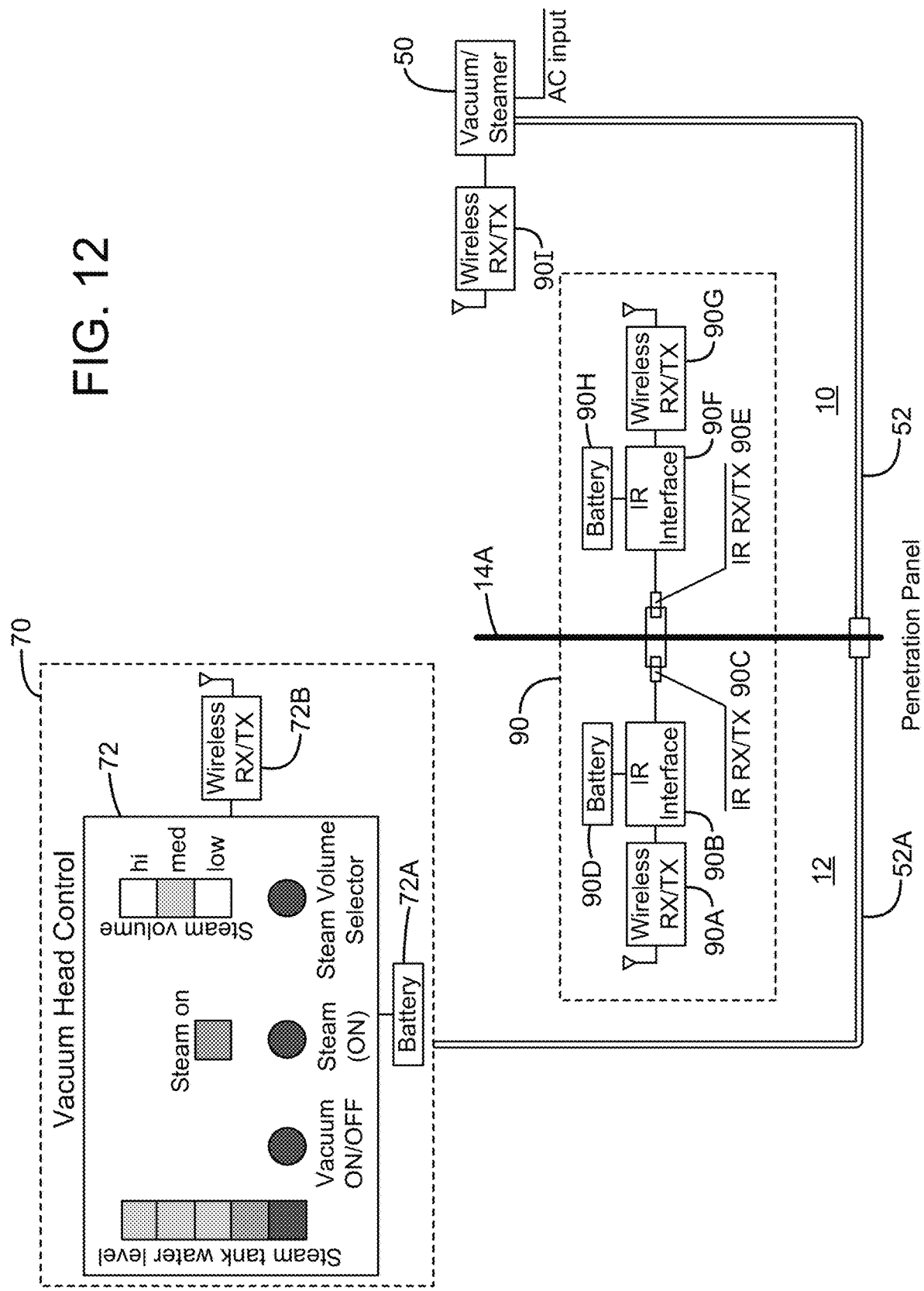
FIGS. 12, 13 and 14 are schematic diagrams of exemplary embodiments of the signal communication system of the system.
Figure 13:
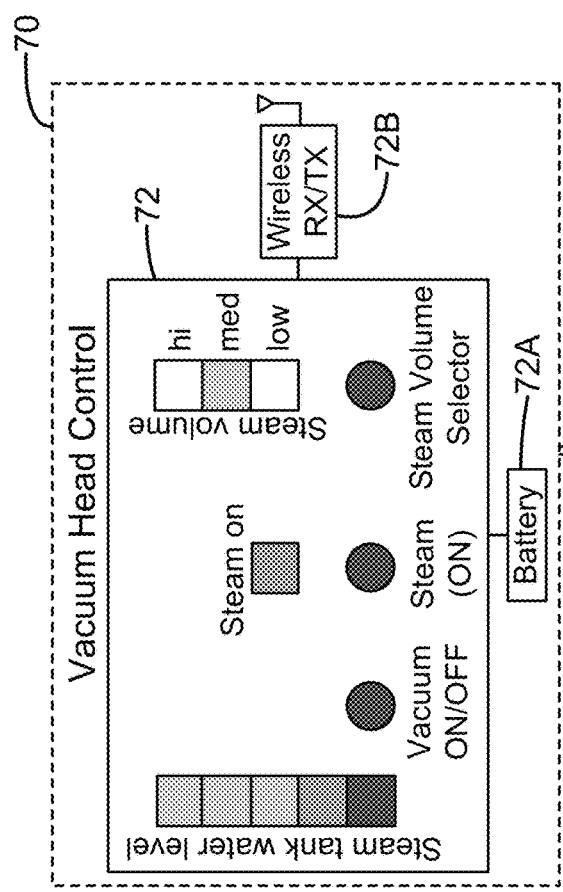
Figure 13:
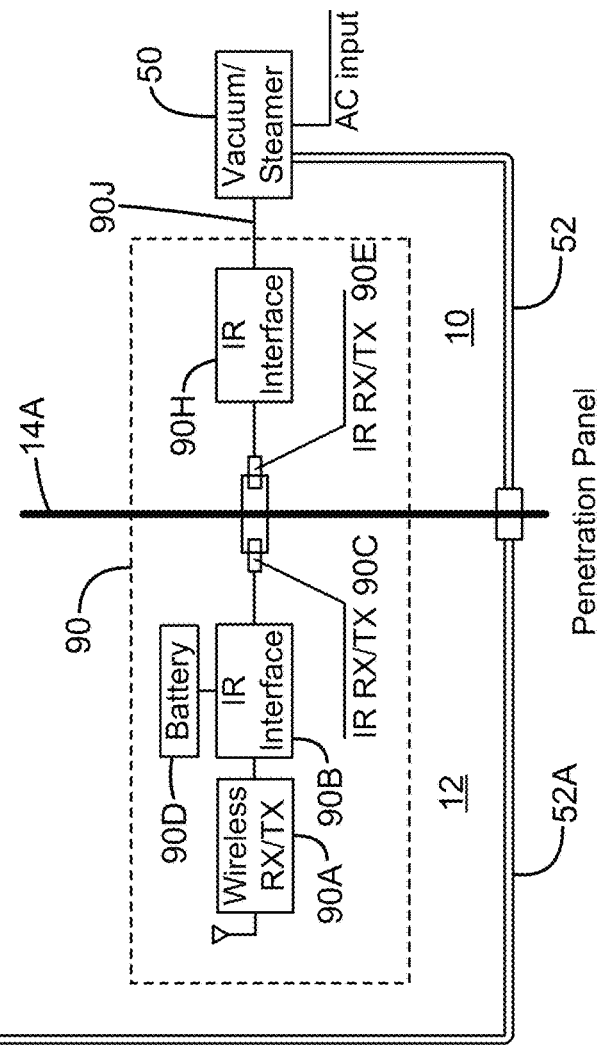

The IR signal controller interface unit 90 may be mounted into the penetration panel between the equipment/computer room and the magnet room. This interface 90 sends the wireless signals of the controls 72 from the unit 70 to the vacuum base/steamer 50 in the Equipment/Computer Room and sends system status signals to the handheld unit 70. FIGS. 11-13 illustrate exemplary embodiments of the IR signal controller interface to control the vacuum handheld unit 70 and the vacuum base/steamer equipment using Bluetooth/RF/IR.

The signal configuration for the commands between the handheld unit and the vacuum base/steamer of the vacuum System can be linked either via wire or via IR/RF/Bluetooth.

FIG. 12 illustrates a communication system which provides command signal communication from the handheld or portable unit 70 to the base vacuum/steamer unit 50. The control panel 72 on the unit 70 includes a non-magnetic battery 72A to power the control panel, and a wireless (RF) receiver/transmitter module 72B connected to the panel. The module provides the capability to wireless transmit the control commands from the panel to a corresponding wireless receiver/transmitter unit 90A comprising the module 90 installed in the penetration panel 14A. The received signals from 90A are converted to IR by IR receiver/transmitter 90B on the magnet room side of the panel 14A for transmission by IR receiver/transmitter 90C through the penetration panel 14A to a corresponding IR receiver/transmitter 90E on the equipment room side of the penetration panel. A non-magnetic battery 90D powers the units 90A, 90B, 90C.

An IR interface 90F is connected to the unit 90E and converts IR to RF or vice versa. The received commands are sent to wireless receiver/transmitter 90G for transmission to the base station 50. The transmitted commands are received at wireless receiver/transmitter unit 90I on the unit 50, which responds to the commands to control operation of the unit 50. A battery 90H powers the units 90E, 90F and 90G. The communication link further allows status data regarding the base unit 50 to be communicated to the handheld unit 70, so that status information can be displayed on the head control 72.

FIG. 13 illustrates an alternate communication system configuration, in which the same reference numbers refer to the same elements. The difference is that, in this embodiment, the control signals from the IR interface 90F are sent directly to the base unit 50 by a wired connection 90J.

FIG. 11 diagrammatically depicts the interface unit 90, positioned in the penetration panel 14A, with the reference numbers conforming to those in FIGS. 12 and 13. Circuit boards 90-AB and 90-FG include the circuitry to perform the functions described above with respect to 90 A, 90B for circuit board 90-Aft and with respect to 90F, 90G for circuit board 90-FG. The unit 90 includes covers 90-1 and 90-2 which are transparent to wireless signals. The penetration panel 14A is electrically conductive and has an opening 14A-1 formed therein. Electrically conductive support structures 14B and 14C are configured to provide a waveguide 14D through the opening and also structural support for the circuit boards 90-AB and 90-FG. Support structure 14B has a threaded male end which is passed through the opening 14A and is engaged by a female threaded end of the the support 14C to secure the structures in place. The waveguide 14D prevents RF noise from passing through the penetration panel while allowing IR energy to pass between the IR receiver/transmitters 90C and 90E.

Figure 14:
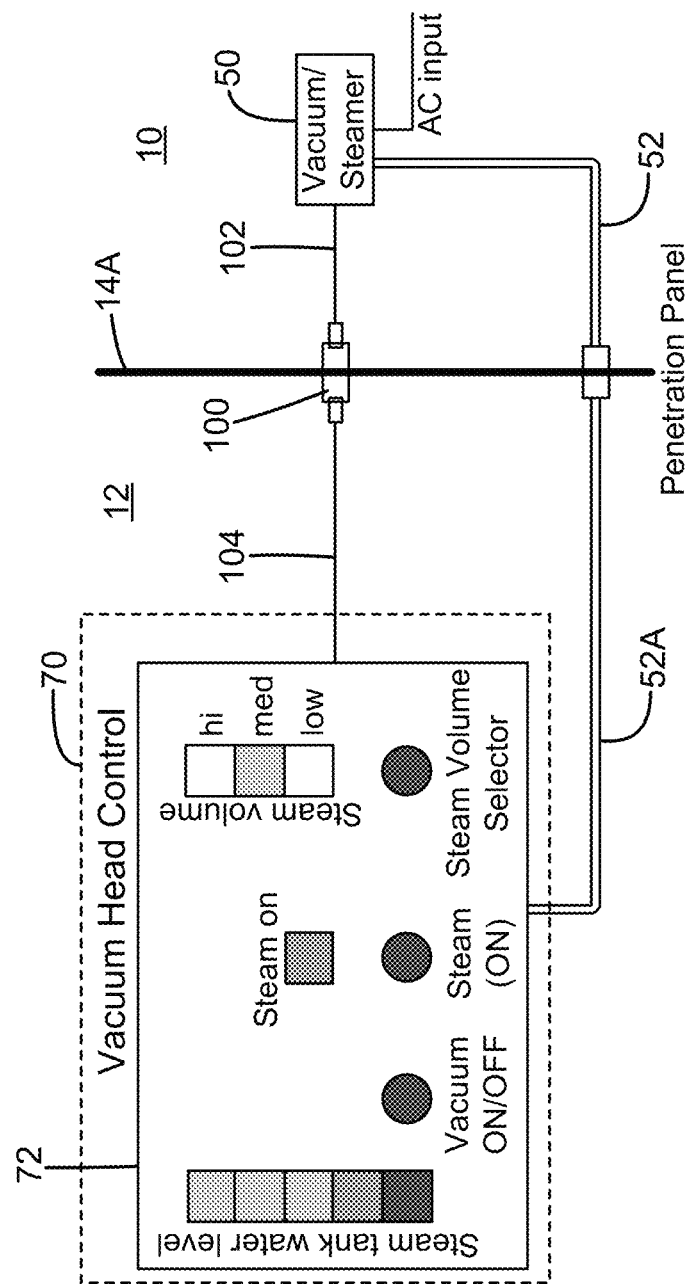

FIG. 14 illustrates a further alternate communication system configuration, in which the same reference number refer to the same elements. In this embodiment, the communication link between the handheld unit 70 in the magnet room 12 and the base unit 50 in the equipment/computer room 10 is a wired link. A low-pass filter 100 is installed in the penetration panel 14 opening, between connectors on each side of the panel. The low-pass filter prevents higher frequency noise from passing through the panel. A cable 102 connects to the base unit 50 in room 10. A non-magnetic cable 104 connects from the penetration panel to the head control 72 of the handheld unit 70. The communication cables could be bundled with the steam vacuum hoses 62 and 52A.

Although the foregoing has been a description and illustration of specific embodiments of the subject matter, various modifications and changes thereto can be made by persons skilled in the art without departing from the scope and spirit of the invention.

What is claimed is:

1. A cleaner system for an MRI installation including a magnet room and an equipment room, the system comprising:
   a base unit configured to supply vacuum and steam, the unit disposed outside the MRI magnet room;
   a hand-held or portable dispensing unit substantially free of magnetic material for use inside the magnet room, the unit including a dispensing tool for delivering vacuum and steam;
   a tubing system for conveying vacuum and steam from the base unit to the handheld unit, the tubing system including a magnet room portion configured for disposition inside the magnet room, the magnet room portion substantially free of magnetic material;
   a control panel inside the magnet room configured to generate control signals to allow the user to control the base unit;
   a communication link configured to communicate the control signals generated by user manipulation of the control panel inside the magnet room to the base unit to control the base unit remotely away from the base unit, the communication link including a signal controller interface in communication with the control panel and mounted to a penetration panel in a wall between the magnet room and the equipment room.

2. The system of claim 1, wherein the communication link includes a wireless signal interface.

3. The system of claim 1, wherein the magnet room portion of the tubing system is connected through a port in a penetration panel between the equipment room and the magnet room of the MRI system.

4. The system of claim 1, wherein the tubing system includes a network of pipes embedded within walls of the magnet room connected to a plurality of ports on a plurality of walls of the magnet room.

5. The system of claim 4, wherein the magnet room portion of the tubing system is configured for connection to any one of the plurality of ports.

6. The system of claim 1 wherein the communication link includes a wired signal link connected between a penetration panel in a wall between the magnet room and the equipment room.

7. The system of claim 1, wherein the magnet room portion of the tubing system includes a steam hose and a vacuum hose connected to the handheld or portable unit.

8. The system of claim 1, wherein the hand-held or portable dispensing unit includes the control panel, the control panel powered by a non-magnetic battery.

9. The system of claim 8, wherein the communication link includes a wired signal link between the control panel and the base unit.

10. The system of claim 1, wherein the base unit comprises:
    a water tank;
    a boiler module for producing steam from water;
    a tank for holding a solution of detergent and/or disinfectant;
    a mixing valve for mixing steam and the solution.

11. The system of claim 10, wherein the control panel is configured to allow the user to control the base unit, with switches to control generation of vacuum and steam, and to display a base unit steam tank water level and a steam volume selected by the user.

12. The system of claim 1, wherein the control panel is mounted on a wall within the magnet room.

13. A cleaner system for an MRI installation including a magnet room and an equipment room separated by a common wall having a penetration panel, the system comprising:
    a base unit configured to supply at least both of vacuum and steam, the base unit disposed outside the MRI magnet room;
    a hand-held or portable dispensing unit substantially free of magnetic material for use inside the magnet room, the unit including a dispensing tool for delivering both of vacuum and steam;
    a control panel configured to be responsive to user manipulation of controls to generate control signals to allow the user to control the base unit, the control panel mounted to the dispensing unit or to a wall or other structure within the magnet room;

a tubing system configured to convey both of vacuum and steam from the base unit to the handheld unit, the tubing system including a magnet room portion configured for disposition inside the magnet room, the magnet room portion substantially free of magnetic material;

a communication link configured to communicate control signals generated by user manipulation of the control panel through the penetration panel to the base unit to control vacuum and steam generation remotely away from the base unit, the communication link including a signal controller interface in communication with the control panel and mounted to the penetration panel.

14. The system of claim 13, wherein the communication link includes:

a first wireless RF receiver/transmitter unit mounted in the hand-held or portable unit and configured to transmit and receive one or both of digital control signals and status signals;

the signal controller interface comprising:

a second wireless RF receiver/transmitter mounted at or adjacent the penetration panel and configured to receive from and transmit RF signals to the first receiver/transmitter;

a first Infrared (IR) interface on a magnet room side of the penetration panel for converting RF signals from the second RF receiver/transmitter into IR signals and to convert IR signals into RF signals;

a first IR receiver/transmitter configured to transmit IR signals through an opening in the penetration panel and to receive IR signals from the penetration panel opening.

15. The system of claim 14, wherein the communication link further comprises, on the equipment room side:

a second IR receiver/transmitter configured to receive and transmit IR signals through the opening;

a second IR interface on an equipment room side of the penetration panel for converting RF signals into IR signals and to convert IR signals into RF signals;

a third wireless RF receiver/transmitter configured to transmit and receive one or both of control signals and status signals;

a fourth wireless RF receiver/transmitter configured to transmit the control signals to the base unit to control the vacuum and steam operation of the base unit.

16. The system of claim 14, wherein the communication link includes:

a second IR receiver/transmitter configured to receive and transmit IR signals through the opening;

a second IR interface on an equipment room side of the penetration panel a wired communication link from the second IR interface to the base unit;

the second IR interface configured to convert the IR signals received from the second IR receiver/transmitter into control signals for transmission over the wired communication link and to convert signals received from the wired communication link into IR signals.

17. The system of claim 13, wherein the penetration panel includes an opening defined by a waveguide structure configured to block passage of RF noise.

18. The system of claim 17, wherein the communication link comprises:

a low pass filter installed in a port in the penetration panel;

a first wired link connected between the filter and the hand-held or portable unit in the magnet room;

a second wired link connected between the filter and the base unit in the equipment room.

19. The system of claim 13, wherein the control panel is mounted to the dispensing unit and is powered by a non-magnetic battery.

* * * * *